United States Patent
Lin et al.

(10) Patent No.: US 10,192,918 B2
(45) Date of Patent: Jan. 29, 2019

(54) IMAGE SENSOR INCLUDING DUAL ISOLATION AND METHOD OF MAKING THE SAME

(71) Applicant: TAIWAN SEMICONDUCTOR MANUFACTURING COMPANY, LTD., Hsinchu (TW)

(72) Inventors: Jeng-Shyan Lin, Tainan (TW); Dun-Nian Yaung, Taipei (TW); Jen-Cheng Liu, Hsinchu (TW); Chun-Chieh Chuang, Tainan (TW); Volume Chien, Sinying (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/886,290

(22) Filed: Oct. 19, 2015

(65) Prior Publication Data
US 2016/0043121 A1     Feb. 11, 2016

Related U.S. Application Data

(62) Division of application No. 12/751,126, filed on Mar. 31, 2010, now Pat. No. 9,196,547.

(60) Provisional application No. 61/166,657, filed on Apr. 3, 2009.

(51) Int. Cl.
*H01L 27/146* (2006.01)
*H01L 21/762* (2006.01)
*H01L 21/8238* (2006.01)

(52) U.S. Cl.
CPC .... *H01L 27/1463* (2013.01); *H01L 21/76229* (2013.01); *H01L 21/823878* (2013.01); *H01L 27/1464* (2013.01); *H01L 27/14643* (2013.01); *H01L 27/14683* (2013.01); *H01L 27/14689* (2013.01); *H01L 27/14621* (2013.01)

(58) Field of Classification Search
CPC ......... H01L 21/76229; H01L 21/76224; H01L 21/76227; H01L 21/76235
See application file for complete search history.

(56) References Cited

U.S. PATENT DOCUMENTS

| 2002/0024067 A1 | 2/2002 | Han |
| 2003/0045071 A1 | 3/2003 | Hong et al. |
| 2005/0079722 A1* | 4/2005 | Yu ....................... H01L 21/3081 438/706 |

(Continued)

FOREIGN PATENT DOCUMENTS

KR    10-2002-065083    *   5/2004  ....... H01L 21/76229

OTHER PUBLICATIONS

Machine Translation/Derwent Record of KR 2002-0065083.*

*Primary Examiner* — Michael Lebentritt
*Assistant Examiner* — Suberr Chi
(74) *Attorney, Agent, or Firm* — Hauptman Ham, LLP

(57) ABSTRACT

An image sensor includes a substrate having a pixel region and a periphery region. The image sensor further includes a first isolation structure formed in the pixel region; the first isolation structure including a first trench having a first depth. The image sensor further includes a second isolation structure formed in the periphery region; the second isolation structure including a second trench having a second depth. The second depth is greater than the first depth.

20 Claims, 13 Drawing Sheets

( Continued )

(56) References Cited

U.S. PATENT DOCUMENTS

| | | | |
|---|---|---|---|
| 2005/0142808 A1* | 6/2005 | Otsuki | H01L 21/76229 438/427 |
| 2005/0233493 A1 | 10/2005 | Augusto | |
| 2007/0004167 A1* | 1/2007 | Lee | H01L 21/76229 438/427 |
| 2008/0057612 A1 | 3/2008 | Doan et al. | |
| 2009/0111254 A1 | 4/2009 | Yang et al. | |
| 2009/0162989 A1 | 6/2009 | Cho et al. | |
| 2009/0242950 A1* | 10/2009 | McCarten | H01L 27/14634 257/292 |

* cited by examiner

IMAGE SENSOR INCLUDING DUAL ISOLATION AND METHOD OF MAKING THE SAME

PRIORITY CLAIM

The present application is a divisional of U.S. application Ser. No. 12/751,126, filed Mar. 31, 2010, which claims priority of U.S. Provisional Application No. 61/166,657, filed Apr. 3, 2009, which are incorporated herein by reference in their entireties.

FIELD OF THE INVENTION

The present invention is generally related to semiconductor devices, and particularly to dual shallow trench isolation. In various embodiments, the dual shallow trench isolation is used in high performance Complementary Metal-Oxide-Semiconductor image sensors.

BACKGROUND

CIS (CMOS Image Sensors) are used in numerous applications including digital still cameras. In semiconductor technologies, image sensors are used for sensing exposed lights projected towards a semiconductor substrate. Generally, these devices utilize an array of active pixels (i.e., image sensor elements or cells) comprising photodiode and other elements (e.g., transistors) to convert images into digital data or electrical signals. CIS products generally include a pixel (or pixel array) region and a periphery region.

STI (shallow trench isolation) is an integrated circuit feature that prevents current leakage between adjacent semiconductor components. Various approaches use a single STI structure for both the pixel array and periphery regions in CIS. That is, the depth of the STI in the pixel array region and that of the periphery region is at the same level.

Dark current is unwanted current generated by pixels in the absence of illumination. Signals related to dark current may be referred to as dark signals. Sources of dark current include impurities in the silicon wafer that can cause damages to the silicon crystal lattice by processing techniques and heat buildup in the pixel region. Excessive dark current may cause leakage and lead to image degradation and poor device performance. As pixels scale down (e.g., in advanced CIS), dark current leakage tolerance also needs to be scaled down.

BRIEF DESCRIPTION OF THE DRAWINGS

The details of one or more embodiments of the invention are set forth in the accompanying drawings and the description below. Other features and advantages of the invention will be apparent from the description, drawings, and claims.

Like reference symbols in the various drawings indicate like elements.

DETAILED DESCRIPTION

Figure 1:
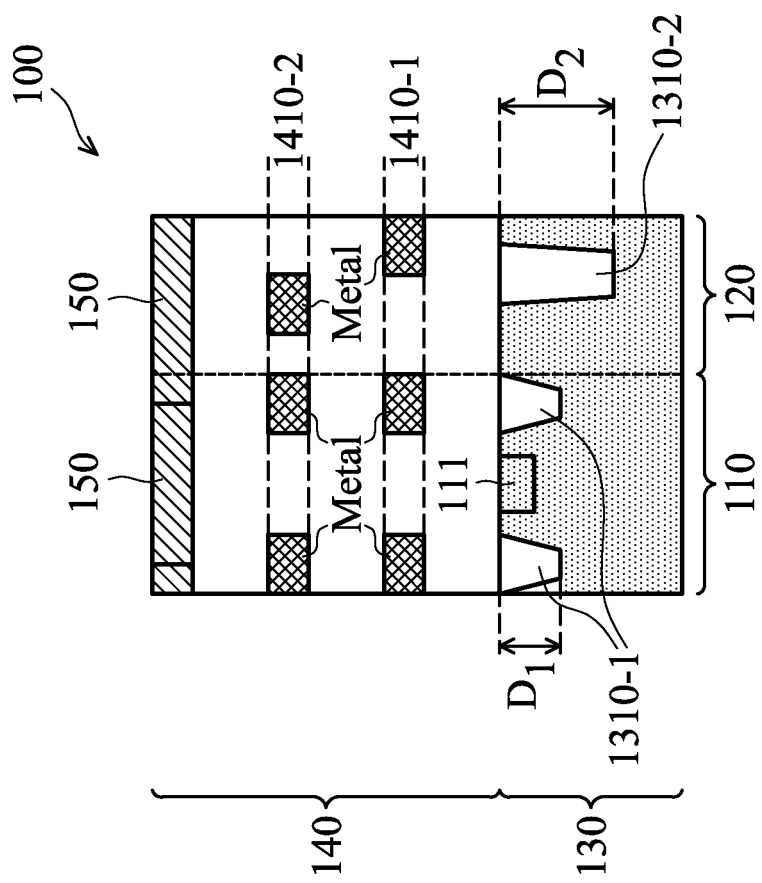
FIG. 1 shows a cross section of an example image sensor that can utilize embodiments of the invention.

Embodiments, or examples, of the invention illustrated in the drawings are now being described using specific languages. It will nevertheless be understood that no limitation of the scope of the invention is thereby intended. Any alterations and modifications in the described embodiments, and any further applications of principles of the invention described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

FIG. 1 shows a cross section of an image sensor 100, in accordance with an embodiment. Image sensor 100 includes a pixel array region 110, a periphery region 120, a substrate (e.g., silicon) 130, a backend process region 140, and filters 150. The below description is by way of the illustrative image sensor 100, but embodiments of the invention are applicable to other devices, such as active pixel sensors, charge coupled device (CCD) sensors or the like, embedded devices (e.g., DRAM (dynamic random access memory)) and those that can be subject to leakage if only one STI structure is used.

Image sensor 100 may be a front-side illumination (FSI) or a backside illumination sensor (BSI). Those skilled in the art will recognize that in FSI technology light is emitted from the front surface of the wafer while in BSI technology light is emitted in the backside of the wafer. Embodiments of the invention are applicable in both FSI and BSI processes.

Pixel array region 110, also known in the art as pixel region, generally includes pixels arranged in arrays (not shown) wherein each pixel may include various devices (e.g., transistors). Pixel array region 110 may also include various elements such as photo detectors (not shown), etc. For illustration purposes, only photodiode 111 is shown in FIG. 1. Photodiode 111 senses the amount of light radiation directed towards pixels, records intensity or brightness of light, etc. Pixel array region 110 may be configured to absorb light radiation and generate optical charges or photo-electrons that are collected and accumulated in a light sensing region of the photo detector (e.g., photo detector 111). Generally, transistors (not shown) in pixel array region 110 include various types of transistors such as reset transistors, source-follower transistors, transfer transistors, etc., and may be configured to readout the generated photo-electrons and convert them into electrical signals. Depending on different devices and applications, voltages used in pixel array region 110 may range from 2.8-3.0V.

Periphery region 120 may be referred to as a logic region because it may include logic circuitry associated with pixels in pixel array region 110. Periphery region 120 typically includes circuitry and inputs/outputs to provide an operation environment for the pixels and to provide support for external communications with the pixels. Example circuitry in periphery region 120 includes transistors, circuitry to drive the pixels to obtain signal charges, A/D converters, processing circuits for forming output signals, electrical connections, other components, etc. Depending on applications, periphery region 120 can have high voltage (e.g., up to 3.3V) usages.

Substrate 130 includes, for example, silicon, silicon carbide, germanium, etc. Substrate 130 may be formed by being doped with semiconductor dopant (e.g., P-type, N-type, etc.). Substrate 130 includes shallow trench features such as shallow trench isolations (STIs) 1310. For illustration purposes, STIs 1310 in pixel array region 110 are referred to as STIs 1310-1 while STIs 1310 in periphery region 120 are referred to as STIs 1310-2. For illustration purposes, only two STIs 1310-1 and one STI 1310-2 are shown, but embodiments of the invention are applicable in situations with various numbers of STIs 1310-1 and 1310-2. STIs 1310 may define and isolate active regions for various electronic devices of image sensor 100.

Embodiments of the invention provide isolation features through STI 1310 based on the need of each pixel area region 110 and periphery region 120. As a result, embodiments include different structures of STIs 1310 (e.g., STIs 1310-1 and 1310-2) wherein an STI structure includes a trench having a depth and the depths (e.g., depths D1 and D2) of STIs 1310-1 and STIs 1310-2 are of different dimensions. For example, in various embodiments, pixel array region 110 includes NMOS devices while periphery region 120 includes both NMOS and PMOS devices having corresponding P- and N-wells. Depending on implementations, the P- and N-wells may be referred to as twin wells. Because of only NMOS devices in pixel array region 110, depth D1 is shallow and provides sufficient isolation for the NMOS devices (e.g., with corresponding poly end caps and others). In contrast, because of both types of NMOS and PMOS devices and corresponding wells (e.g., twin wells) are present in periphery region 120, embodiments of the invention provide additional and more protective isolation in the periphery region 120. That is, depth D2 is deeper than depth D1, resulting in STIs 1310-2 being deeper/larger than STIs 1310-1. If depth D1 is deeper than necessary (e.g., the same depth as D2), STI 1310-1 would be larger and have a larger interface (e.g., larger side walls and bottoms) with substrate 130 and therefore would allow additional opportunity for interface leakage current and leakage around corners of STIs 1310-1. In contrast, without effective isolation (e.g., deeper/larger STIs) in periphery region 120 (e.g., depth D2 is shorter or is the same as depth D1), dark current would leak between the wells (e.g., leak between PMOS device and NMOS substrate). In effect, embodiments of the invention improve performance (e.g., dark signals/dark current performance) as compared to other approaches where only one structure of STI with a single depth is used. The single STI structure does not provide the appropriate isolation needed for each of the pixel array region 110 and periphery region 120. Depending on applications, depth D1 may be in the range of 100-4000 Å while depth D2 may be in the range of 2500-4500 Å, even though other ranges are all within the scope of the invention. In an embodiment, depth D1 is about 1000 Å while depth D2 is about 4000 Å.

Backend process region 140 refers to a region or structure where backend processes may be performed on a semiconductor wafer. Those skilled in the art will recognize that a semiconductor fabrication process generally includes a front-end process (front end of line—FEOL) for semiconductor devices (e.g., transistors, resistors, capacitors, etc.) to be fabricated up to but not including metal one layer. In contrast, a backend process (or back end of line—BEOL) interconnects devices within the metal layers, forms electrical connections to external devices, etc. Backend process regions or structures (e.g., region 140) generally include vias, inter-level dielectrics, metal layers, passivation layers, bonding pads, packaging, etc. In an embodiment, front-end process refers to semiconductor fabrication process up to the contact process while the backend process refers to processes after that. For illustration purposes, backend process region 140 in FIG. 1 shows only metal layers 1410 (e.g., layers 1410-1, 1410-2, etc.), but embodiments of the invention are applicable to other elements in backend process region 140. Metal layers (e.g., layers 1410) are used to provide connections between the various electronic devices of image sensor 100.

Color filters 150 are to filter colors and include, for example, blue-, green-, red-color filters, etc.

Figure 2:
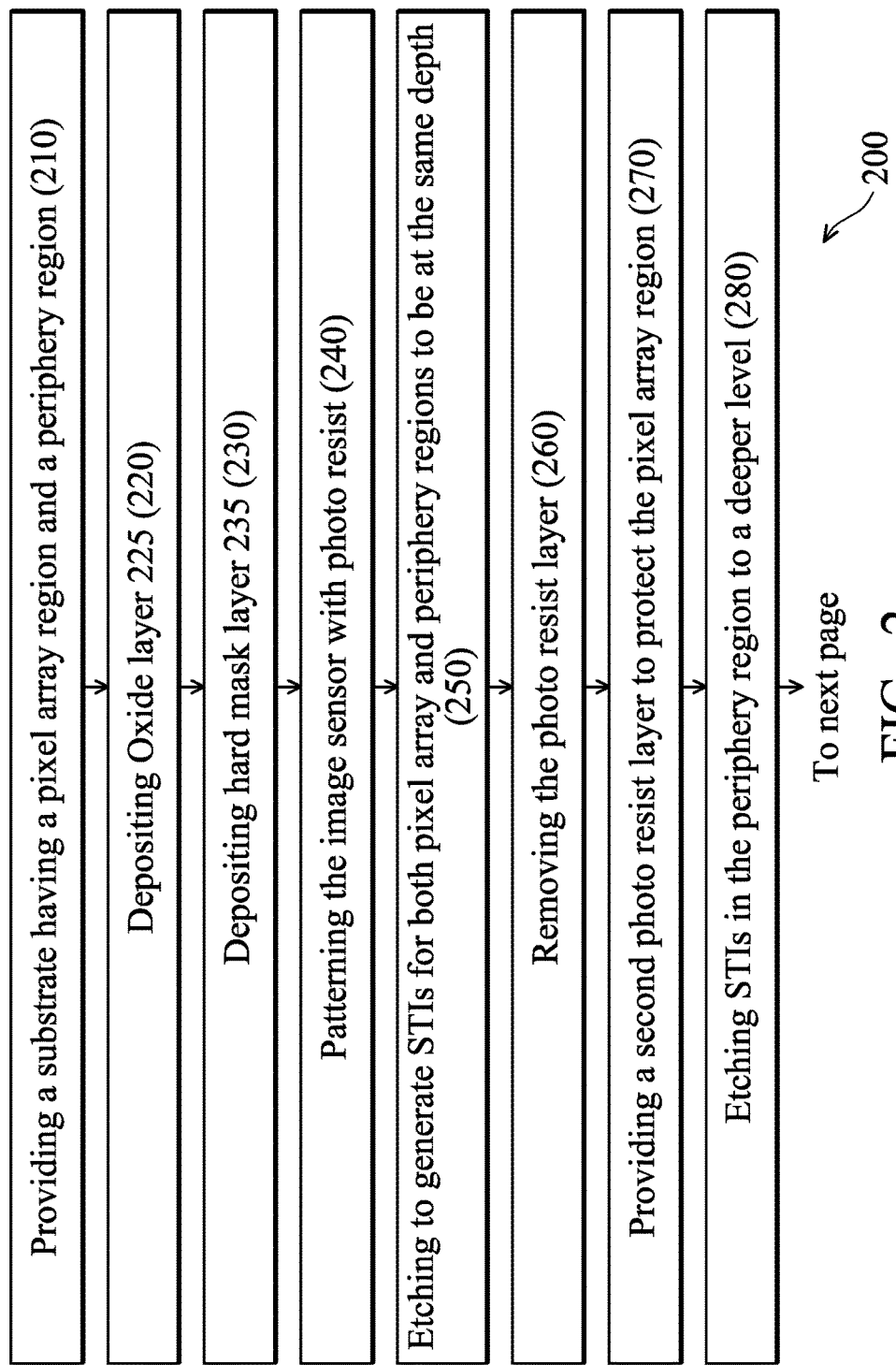
FIG. 2 shows a flowchart illustrating a first embodiment for a method of fabricating an image sensor.
Figure 2:
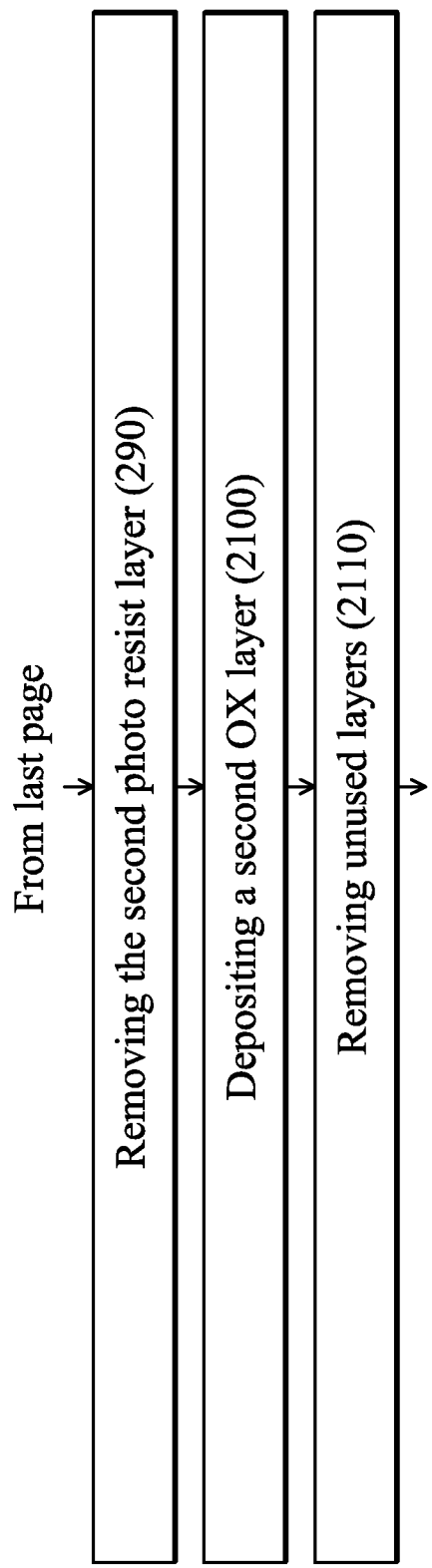
Figure 3:
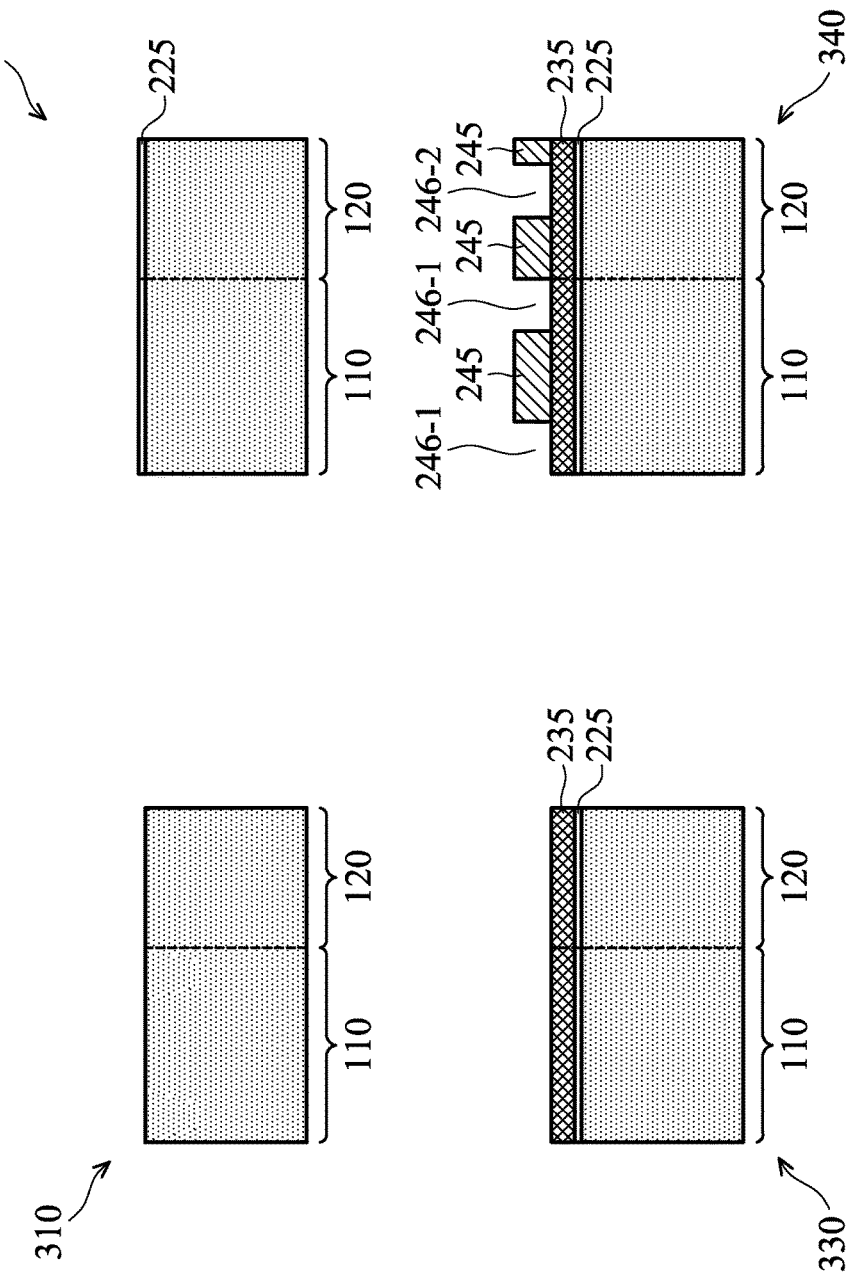
FIG. 3 shows images of the image sensor corresponding to the blocks in FIG. 2.
Figure 3:
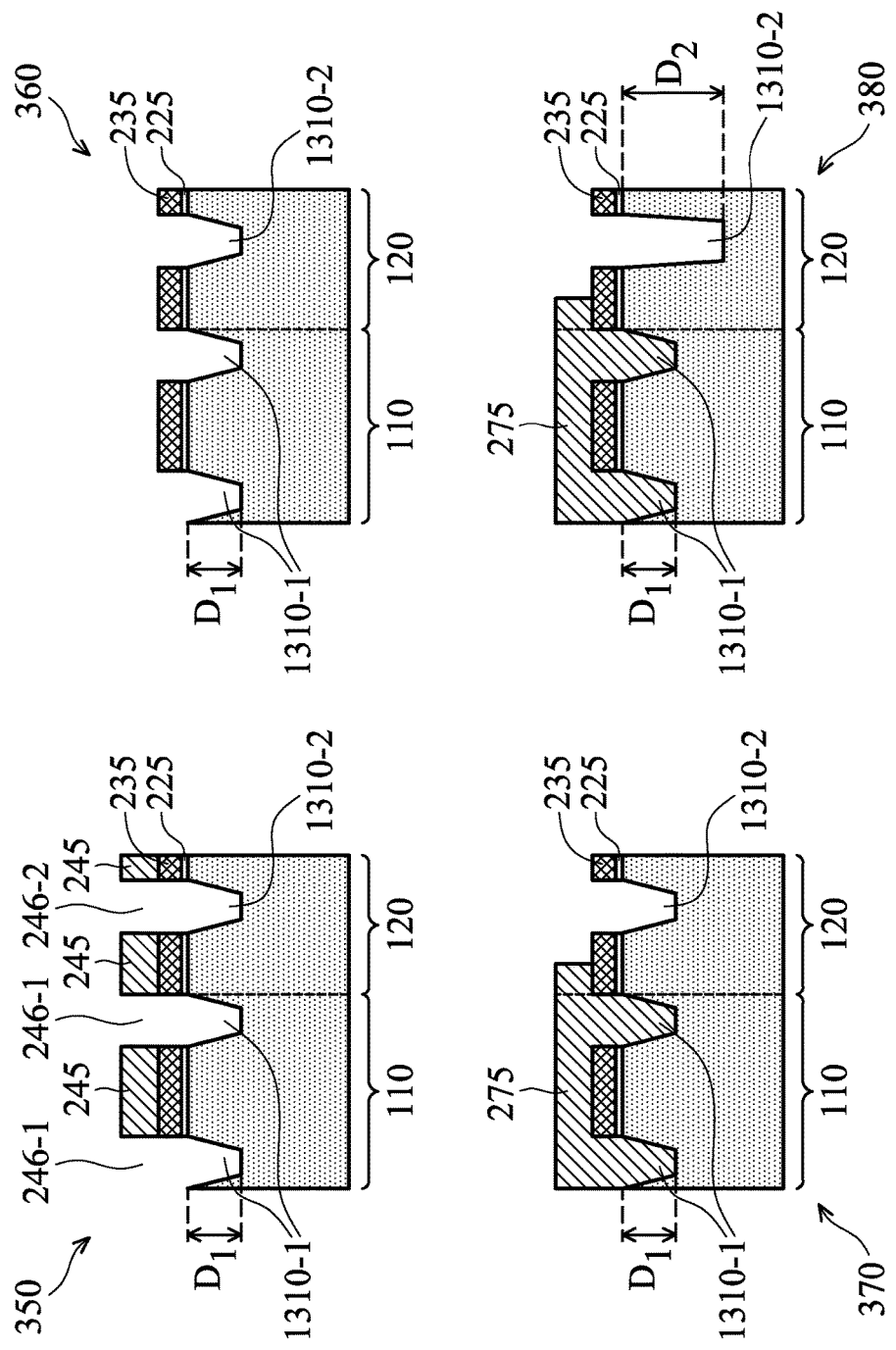
Figure 3:
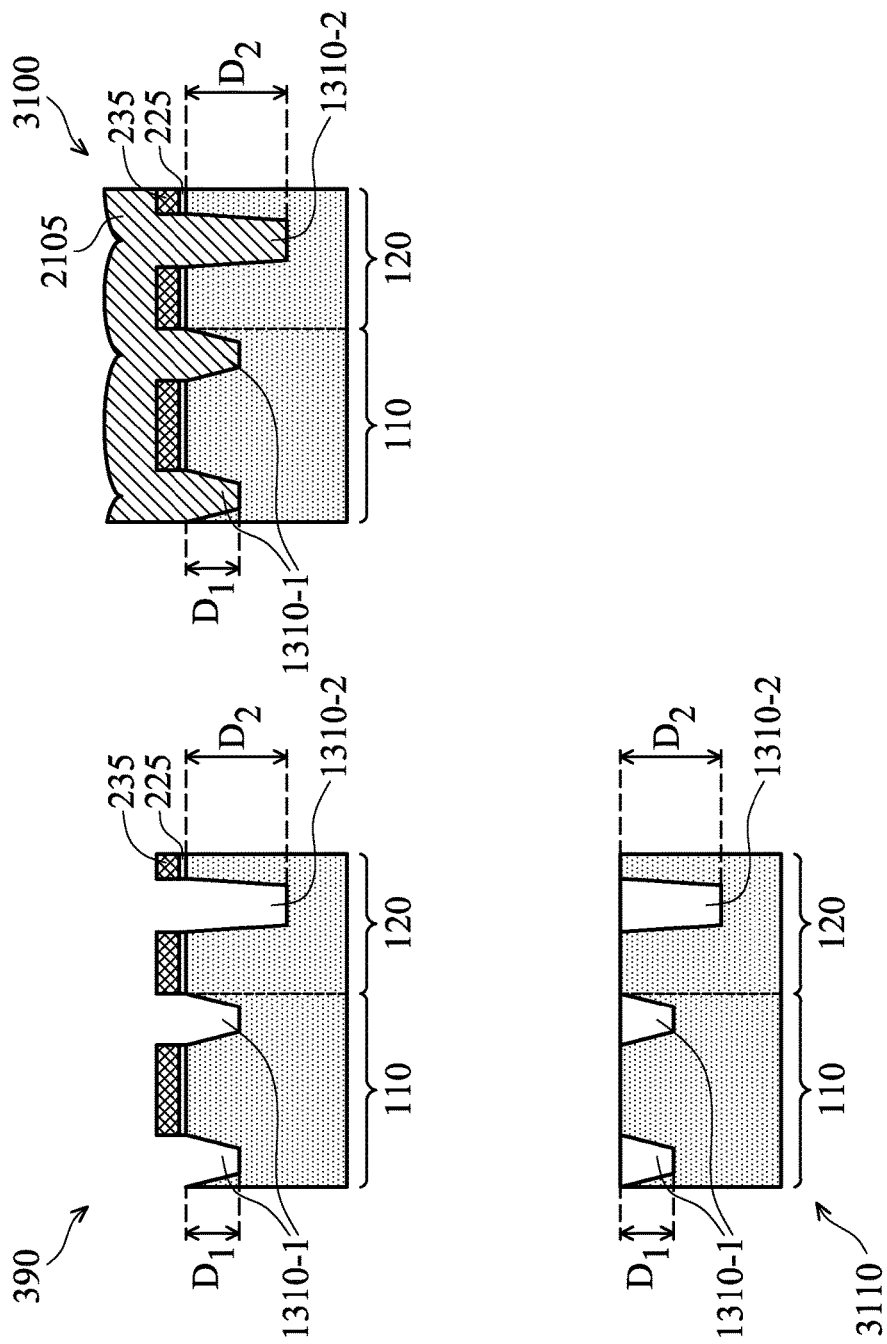

FIG. 2 shows a flowchart 200 illustrating a first method embodiment for fabricating an image sensor (e.g., image sensor 100). For illustration purposes, only steps related a front-end process are provided. Once the front-end process is complete, backend process may be performed in accordance with various mechanisms. FIG. 3 shows images 310-3100 corresponding to blocks 210-2100 in FIG. 2, respectively.

In block 210, substrate 130 of image sensor 100 having pixel array region 110 and peripheral region 120 is provided, shown as image 310 in FIG. 3.

In block 220, oxide (OX) layer 225 is deposited on top of substrate 130 in both pixel array region 110 and periphery region 120, shown as image 320 in FIG. 3.

In block 230, hard mask layer 235 is deposited on top of layer 225 in both pixel array region 110 and periphery region 120, shown as image 330 in FIG. 3. Depending on applications, a hard mask can be SiN film, SiON or the like.

In block 240, image sensor 100 having layers OX 225 and hard mask layer 235 is photo patterned with a photo resist layer 245 for STIs in both pixel array region 110 and periphery region 120 (e.g., STIs 1310-1 and 1310-2), shown as image 340. Photo resist layer 245 includes openings 246-1 and 246-2 that correspond to STIs 1310-1 and 1310-2, respectively. This block 240 includes photo resist coating with layer 245, masking over the image sensor 100, exposing and forming openings 246-1 and 246-2.

In block 250, STIs 1310 for both pixel array region 110 and periphery array region 120 (e.g., STIs 1310-1 and STIs 1310-2) are created by etching hard mask layer 235, OX layer 225, and substrate 130 through openings 246-1 and 246-2, respectively. At this stage, STIs 1310-1 and 1310-20 are at the same level, i.e., depth D1 and D2 are equal or substantially equal. Alternatively expressed, STIs 1310-2 are at the depth D1. Block 250 corresponds to image 350 in FIG. 3.

In block 260, photo resist layer 245 is removed from image sensor 100, shown as image 360 in FIG. 3.

In block 270, a second photo resist layer (e.g., layer 275) is provided to protect the pixel array area 110 including STIs 1310-1. Block 270 corresponds to image 370 in FIG. 3.

In block 280, STIs 1310-2 of periphery region 120 are further etched for a deeper depth, e.g., from depth D1 to depth D2, shown as image 380 in FIG. 3.

In block 290, photo resister layer 275 is removed from image sensor 100, shown as image 390.

In block 2100, image sensor 100 having both STIs 1310-1 and 1310-2 is deposited with a second OX layer, e.g., layer 2105. In an embodiment, depositing layer 2105 is done by using an HDP (high density plasma) technique, but other techniques such as TEOS Oxide (Tetraethyl Orthosilicate, $Si(OC_2H_5)$) may be used, which include a relatively inert material but provides good conformality of coating, e.g., the deposited film having the same thickness regardless of the geometry of the underlying features.

In block 2110, unused layers (e.g., layers 235 and 225) are removed and STIs 1310 are polished using CMP (Chemical Mechanical Polishing), resulting in image 3110.

Figure 4:
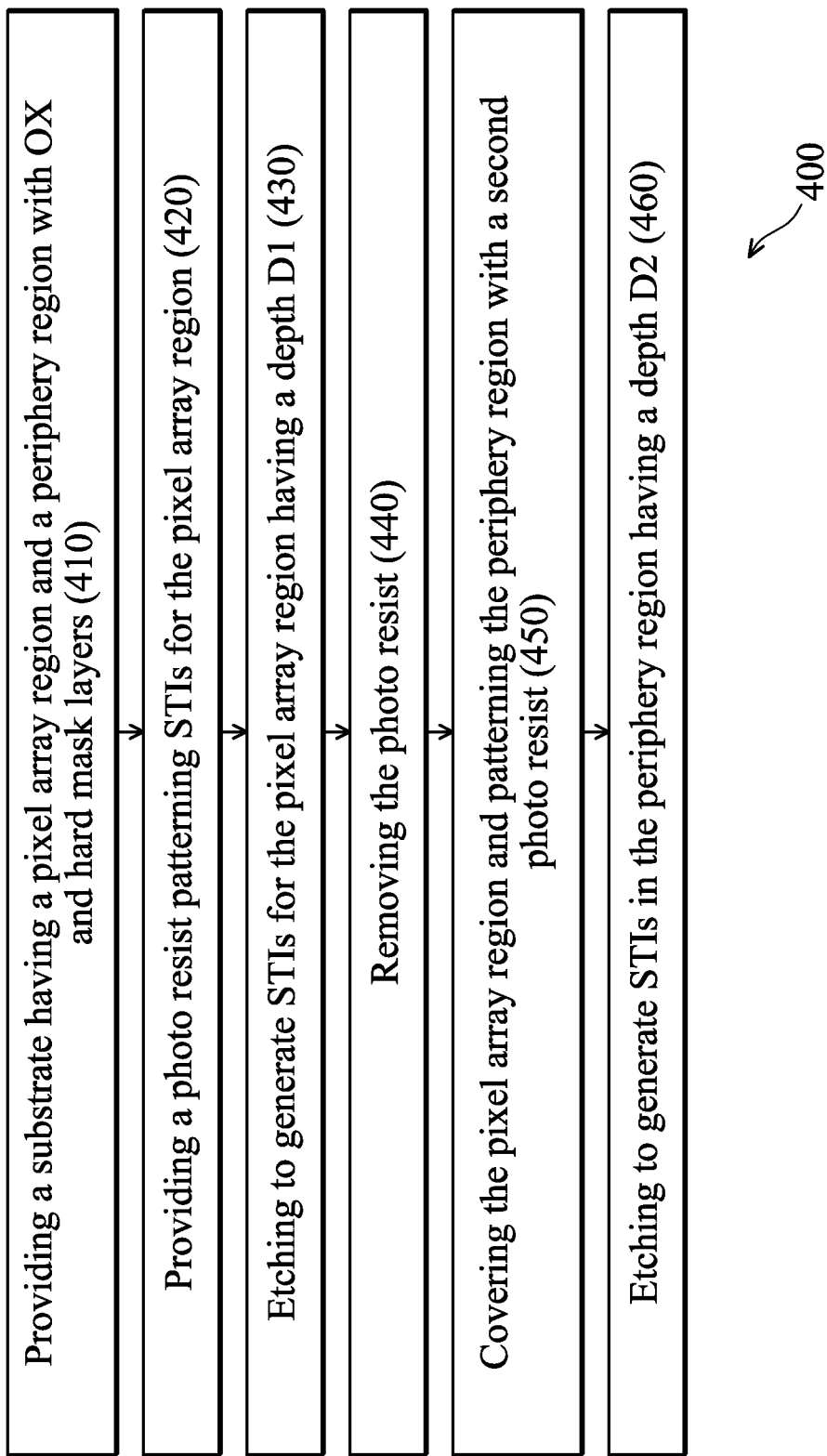
FIG. 4 shows a flowchart illustrating a second embodiment for a method of fabricating an image sensor.
Figure 5:
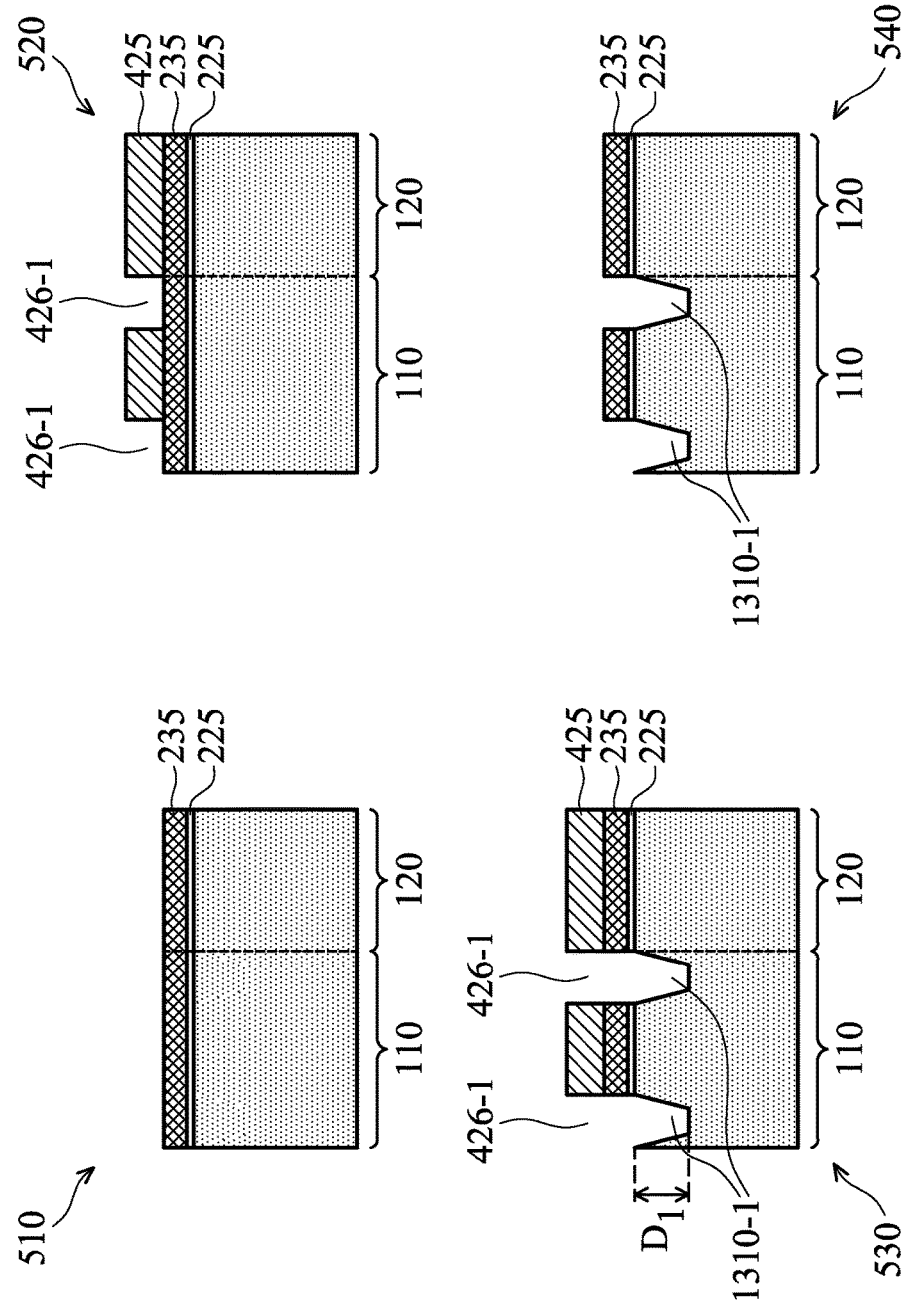
FIG. 5 shows images of the image sensor corresponding to the blocks in FIG. 4.
Figure 5:
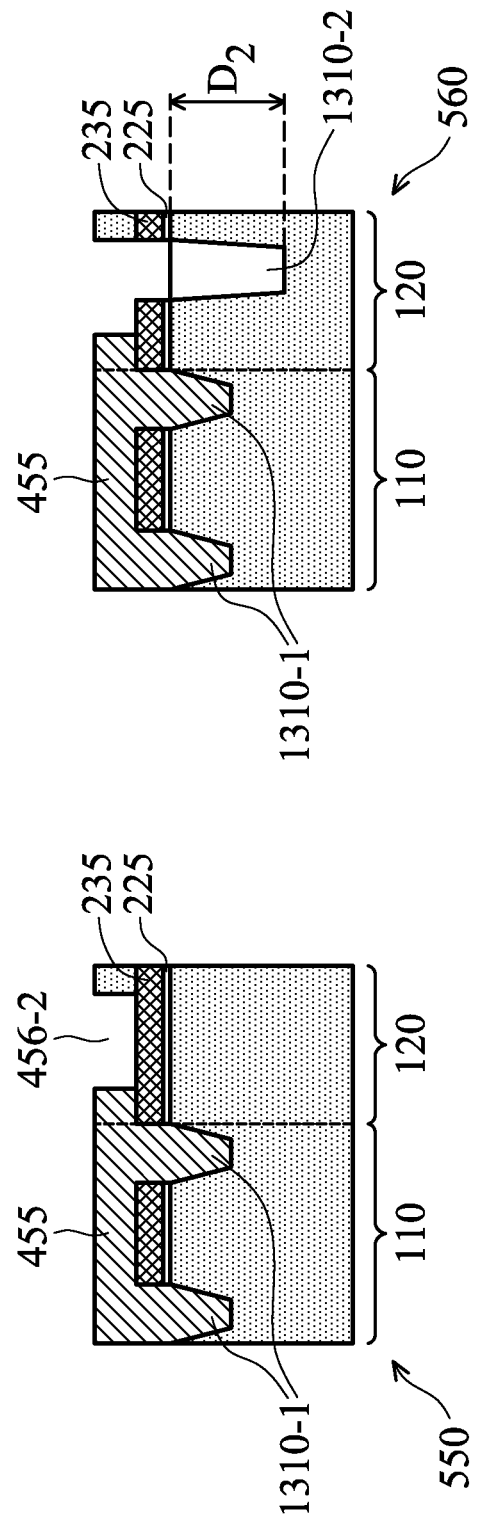

FIG. 4 shows a flowchart 400 illustrating a second method embodiment in fabricating an image sensor (e.g., sensor 100). FIG. 5 shows images 510-560 corresponding to block 410-460, respectively.

In block 410, substrate 130 of image sensor 100 having OX layer 225 and hard mask layer 235 is provided. This substrate 130 represented by image 510 in FIG. 5 was created as described above with reference to image 330.

In block 420, a photo resist layer 425 is deposited on top of layer 235 patterning for STIs in the pixel array region 110 (e.g., STIs 1310-1). This patterning provides opening 426-1, as shown in image 520.

In block 430, STIs in the pixel array region 110 (e.g., STIs 1310-1) are created by etching via openings 426-1 through layers 225, 235, and substrate 130. STIs 1310-1 thus include a depth D1. Block 430 corresponds to image 530.

In block 440, layer 425 is removed, as shown in image 540.

In block 450, pixel array region 110 having STIs 1310-1 is covered with a photo resist layer (e.g., layer 455) having openings 456-2 patterning for STIs 1310-2 in periphery region 120, as shown in image 550.

In block 460, STIs 1310-2, via openings 456-2, are created having a depth D2 that is deeper than depth D1, as shown in image 560. After this stage sensor 100 may be processed using blocks 290 to 2110 as described above with reference to FIG. 2.

In the above embodiment, extra processes such as photo resist coating and dry etch back may be performed over the image sensor having STIs 1310-1 before the second photo resist (block 450) is performed to improve surface planarity and reduce stripe defects that could be caused by forming the first STI 11310-1 (block 430).

Figure 6:
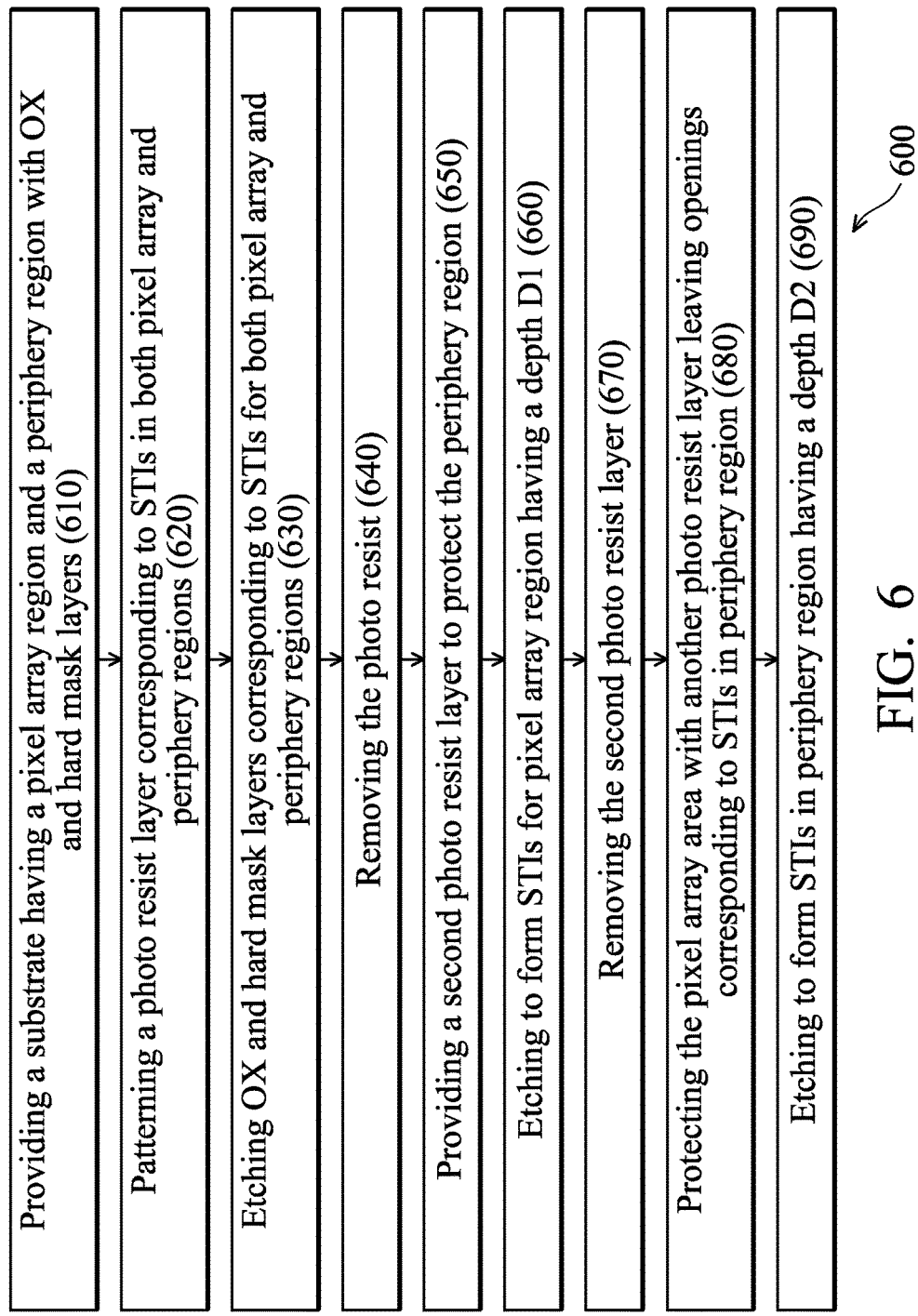
FIG. 6 shows a flowchart illustrating a third embodiment for a method of fabricating an image sensor.
Figure 7:
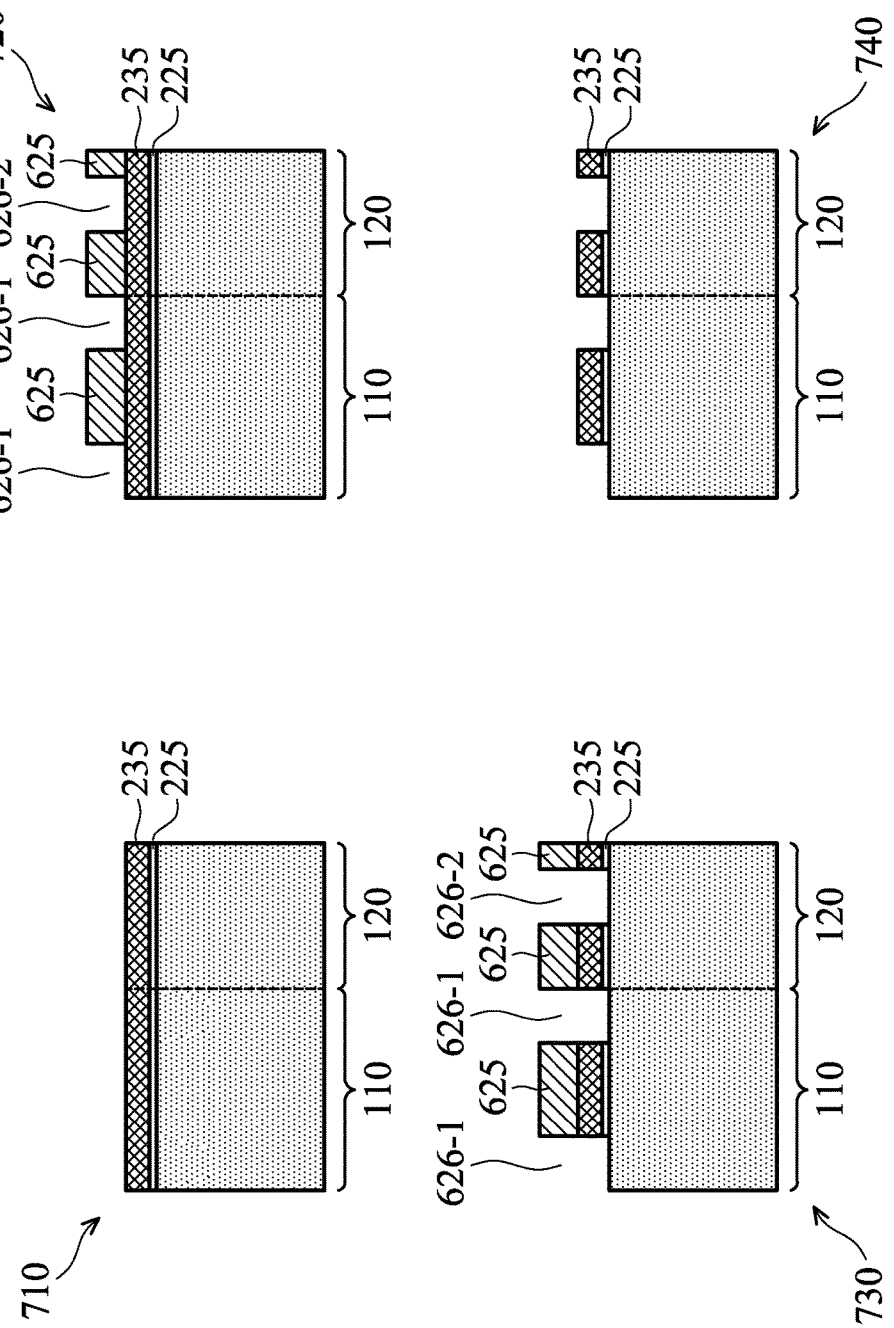
FIG. 7 shows images of the image sensor corresponding to the blocks in FIG. 6.
Figure 7:
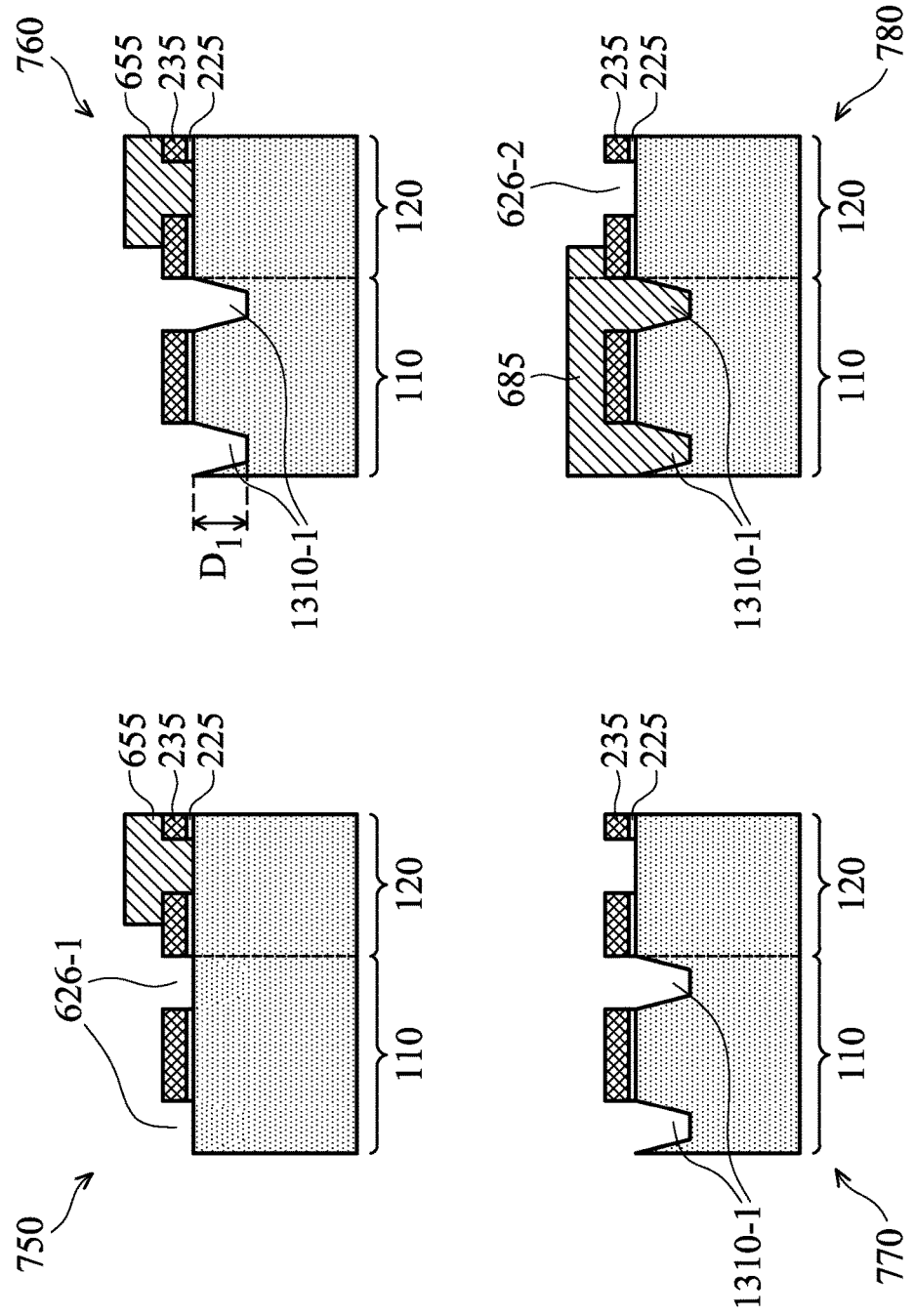
Figure 7:
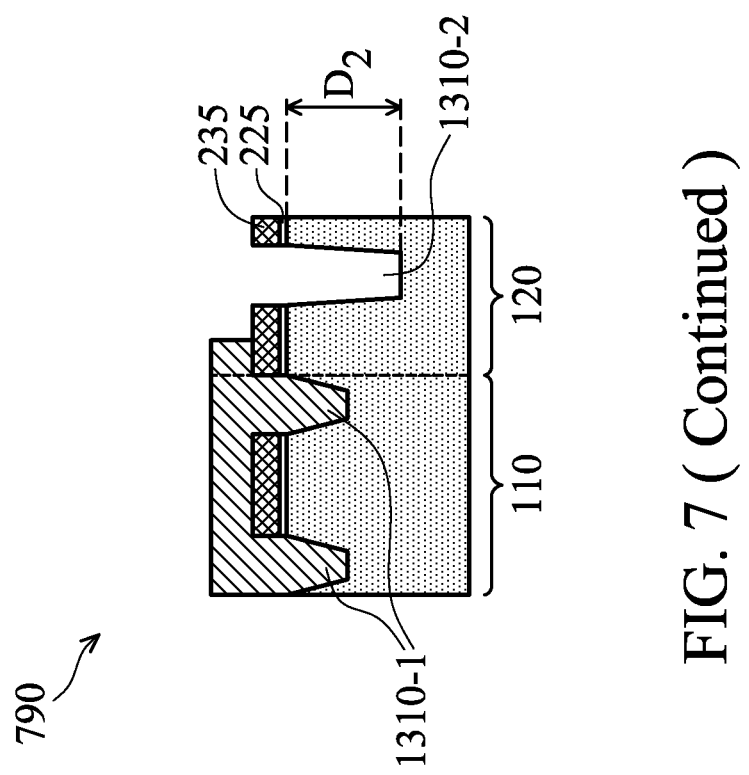

FIG. 6 shows a flowchart 600 illustrating a third method embodiment in fabricating an image sensor (e.g., sensor 110). FIG. 7 shows images 710-790 corresponding to blocks 610-690 respectively.

In block 610, substrate 130 of image sensor 100 having a pixel array region 110 and a periphery region 120 with layers OX 225 and hard mask 235 is provided. This substrate 130 represented by image 710 in FIG. 7 was created as described above with reference to image 330.

In block 620, a photo resist layer (e.g., layer 625) is deposited on top of layer 235. Layer 625 provides patterning for layers 235 and 225 corresponding to STIs for both pixel array region 110 and periphery region 120 (e.g., STIs 1310-1 and 1310-2).

Layer 625 thus includes openings 626-1 and 626-2 for pixel array region 110 and periphery region 120 respectively.

In block 630, layers 235 and 225 corresponding to STIs 1310-1 and 1310-2 are etched through openings 626-1 and 626-2.

In block 640 photo resist layer 625 is removed resulting in image 740.

In block 650, another photo resist layer (e.g., layer 655) is deposited to cover the opening 626-2 corresponding to STIs 1310-2. This layer 655 protects periphery region 120.

In block 660, substrate 130 is etched to form STIs for pixel array region 110 (e.g., STIs 1310-1) having a depth D1, shown as image 760.

In block 670, layer 655 is removed resulting in image 770.

In block 680, pixel array region 110 is protected with another photo resist layer (e.g., layer 685), resulting in image 780.

In block 690, substrate 130 of periphery region 120 is etched to from STIs for periphery region 120 (e.g., STI 1310-2) having a depth D2, which is deeper than depth D1. Block 690 corresponds to image 790. After this stage, sensor 100 is processed in accordance with blocks 290-2110 in FIG. 2 as described above.

In the above method embodiments, various techniques (e.g., etching, patterning) are discussed for illustration purposes, equivalences and/or different techniques may be used to achieve the same results as described above are within scope of embodiments of the invention, and the invention is not limited to a particular technique. For example, patterning may be done by photolithography, etching may be done by plasma etching to form various trenches and filling the trench with a dielectric material such as silicon oxide by a chemical vapor deposition (CVD). To achieve a better planar surface, the CVD process may use a high density plasma CVD (HDPCVD). The patterned photo resist may be removed using wet stripping or plasma ashing, etc. Depending on applications, different types of hard masks may be used, including, for example deep ultraviolet (DUV), I-line, 193-namometer masks, etc., or the like. DUV and 193 masks can be used to serve higher resolution patterns. Selecting a method embodiment is a design choice, considering various factors such as cost and quality. For example, the second and third embodiments can provide quality STI etching profile, but are more expensive.

A number of embodiments of the invention have been described. It will nevertheless be understood that various variations and/or modifications may be made without departing from the spirit and scope of the invention. For example, the above method embodiments show exemplary steps, but they are not necessarily required to be performed in the order shown. Additionally, steps may be added, replaced, changed order, and/or eliminated as appropriate, in accordance with the spirit and scope of embodiment of the invention.

One aspect of this description relates to an image sensor. The image sensor includes a substrate having a pixel region and a periphery region. The image sensor further includes a first isolation structure formed in the pixel region; the first isolation structure including a first trench having a first depth. The image sensor further includes a second isolation structure formed in the periphery region; the second isolation structure including a second trench having a second depth. The second depth is greater than the first depth.

Another aspect of this description relates to a method including providing a mask over a substrate, wherein the substrate has a pixel area and a periphery area. The method further includes patterning in the pixel area. The method further includes etching the mask and the substrate to form a first STI structure having a first depth. The method further includes protecting the pixel area. The method further includes patterning in the periphery area. The method further includes etching the mask and the substrate to from a second STI structure having a second depth deeper than the first depth.

Still another aspect of this description relates to a method including providing a mask over the substrate, wherein the substrate has a pixel area and a periphery area. The method further includes patterning a first opening in the pixel area and a second opening in the periphery area. The method further includes etching the mask via the first opening and the second opening. The method further includes protecting the periphery area. The method further includes etching the substrate via the first opening to form a first STI structure having a first depth. The method further includes protecting the pixel area. The method further includes etching the substrate via the second opening to form a second STI structure having a second depth deeper than the first depth.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. A method comprising:
    providing a mask over a substrate, wherein the substrate has a pixel area and a periphery area;
    patterning a first opening in the pixel area and a second opening in the periphery area;
    etching the mask via the first opening and the second opening;
    protecting an entirety of the periphery area;
    etching the substrate via the first opening to form a first STI structure having a first depth;
    protecting the pixel area;
    etching the substrate via the second opening to form a second STI structure having a second depth deeper than the first depth;
    depositing an oxide layer in the first and the second STI structures;
    removing the mask and an entirety of the oxide layer located above a top surface of the substrate, wherein after removal a surface of the oxide layer is coplanar with the top surface of the substrate;
    forming at least one photo detector comprising one or more first NMOS devices in the pixel area, with the proviso that the pixel area does not contain any PMOS devices; and
    forming second NMOS devices and PMOS devices in the periphery area.

2. The method of claim 1, wherein the depositing of the oxide layer comprises using a high density plasma (HDP) or a tetraethyl orthosilicate (TEOS) technique.

3. The method of claim 1, wherein the mask is selected from the group consisting of SiN film and SiON.

4. The method of claim 1, wherein the substrate is a semiconductor device selected from the group consisting of a CMOS image sensor, an active pixel sensor, a charge coupled device sensor, and an embedded DRAM.

5. The method of claim 1, wherein the substrate is a CMOS image sensor selected from front-side illumination and backside illumination.

6. The method of claim 1, wherein the first depth ranges from 100 Å to 4000 Å and the second depth ranges from 2500 Å to 4500 Å.

7. The method of claim 1, further comprising depositing an oxide layer between the substrate and the mask and etching the oxide layer via the first opening and the second opening.

8. The method of claim 1, wherein removing the mask and the entirety of the oxide layer located above the top surface of the substrate comprises using chemical mechanical polishing.

9. A method comprising:
    patterning a first photo resist layer over a mask to expose a first portion of a substrate, wherein the first portion is in a pixel array region of the substrate;
    etching the mask and the first portion of the substrate using the first photo resist layer as a lithography mask to form a first opening having a first depth in the first portion of the substrate;
    protecting the first portion of the substrate using a second photo resist layer, wherein the second photo resist layer exposes a second portion of the substrate, the second portion is in a peripheral region of the substrate, the second portion is protected during the etching of the first portion;
    etching the mask and the second portion of the substrate to form a second opening having a second depth in the second portion of the substrate, wherein the second depth is greater than the first depth;
    filling the first opening and the second opening with an insulating material;
    forming at least one photo detector in the pixel array region, wherein the forming of the at least one photo detector comprises forming one or more first NMOS devices in the pixel array region with the proviso that the pixel array region does not contain any PMOS devices; and
    forming second NMOS devices and PMOS devices in the peripheral region.

10. The method of claim 9, wherein etching the second portion comprises etching the second portion after protecting the first portion.

11. The method of claim 9, wherein etching the first portion occurs prior to protecting the first portion.

12. A method comprising:
    providing a mask over a substrate, wherein the substrate has a pixel area and a periphery area;
    depositing a photo resist layer over the mask;
    patterning the photo resist layer to form an opening therein;
    etching the mask and the substrate via the opening using the photo resist layer as a lithography mask to form a first STI structure having a first depth in the pixel area, wherein the periphery area is protected during the etching of the mask and the substrate;
    protecting the pixel area;
    etching the mask and the substrate to form a second STI structure in the periphery area, the second STI structure having a second depth deeper than the first depth;
    forming at least one photo detector comprising one or more first NMOS devices in the pixel area, with the proviso that the pixel area does not contain any PMOS devices; and
    forming second NMOS devices and PMOS devices in the periphery area.

13. The method of claim 12, further comprising depositing a first oxide layer in the first and the second STI structures.

14. The method of claim 13, wherein the depositing of the first oxide layer comprises using a high density plasma (HDP) or a tetraethyl orthosilicate (TEOS) technique.

15. The method of claim 13, further comprising depositing a second oxide layer between the substrate and the mask.

16. The method of claim 15, further comprising etching the second oxide layer to form the first STI and the second STI structure.

17. The method of claim 16, further comprising:
    depositing another photo resist layer to cover the first STI structure and the mask; and patterning the another photo resist layer to form another opening therein, wherein the forming of the second STI structure comprises etching the mask, the second oxide layer and the substrate via the another opening.

18. The method of claim 17, further comprising removing the mask and the second oxide layer from the substrate.

19. The method of claim 12, wherein the providing of the mask comprises depositing the mask over both the pixel area and the periphery area.

20. The method of claim 12, wherein the providing of the mask over the substrate comprises depositing a SiN film or a SiON film over the substrate.

* * * * *